US008874052B2

(12) United States Patent
Goedken et al.

(10) Patent No.: US 8,874,052 B2
(45) Date of Patent: Oct. 28, 2014

(54) METHOD AND APPARATUS FOR IMPROVING EFFICIENCY AND DISTORTION LEAKAGE IN A WIRELESS POWER AMPLIFIER

(71) Applicant: Motorola Mobility LLC, Libertyville, IL (US)

(72) Inventors: Ryan J. Goedken, Lake Zurich, IL (US); Thomas D. Nagode, Vernon Hills, IL (US); Dale G. Schwent, Schaumburg, IL (US)

(73) Assignee: Motorola Mobility LLC, Libertyville, IL (US)

( * ) Notice: Subject to any disclaimer, the term of this patent is extended or adjusted under 35 U.S.C. 154(b) by 0 days.

(21) Appl. No.: 13/677,999

(22) Filed: Nov. 15, 2012

(65) Prior Publication Data

US 2014/0135050 A1    May 15, 2014

(51) Int. Cl.
*H04B 1/04* (2006.01)
*H01Q 11/12* (2006.01)
*H03G 1/00* (2006.01)
*H04W 72/04* (2009.01)

(52) U.S. Cl.
CPC ............... *H03G 1/00* (2013.01); *H04W 72/04* (2013.01)
USPC ...................... 455/127.1; 455/114.3; 375/297

(58) Field of Classification Search
CPC .... H04B 1/0475; H04B 1/525; H03F 1/3247; H04L 27/368
USPC ............ 455/91, 108, 114.2–115.1, 115.4, 455/127.1–127.4; 375/295–297, 312
See application file for complete search history.

(56) References Cited

U.S. PATENT DOCUMENTS

| | | | |
|---|---|---|---|
| 6,160,449 A | 12/2000 | Klomsdorf et al. | |
| 6,166,598 A | 12/2000 | Schlueter | |
| 6,281,748 B1 | 8/2001 | Klomsdorf et al. | |
| 6,417,736 B1 | 7/2002 | Lewyn | |
| 6,864,745 B2 * | 3/2005 | Ode et al. | 330/149 |
| 8,055,215 B2 * | 11/2011 | Hara et al. | 455/114.2 |
| 8,442,461 B2 * | 5/2013 | Norimatsu et al. | 455/115.2 |
| 2002/0065048 A1 * | 5/2002 | Nagatani et al. | 455/63 |

(Continued)

OTHER PUBLICATIONS

Stephen Mann, Mark Beach, Paul Warr, Joe Mc Geehan; "Increasing Talk-Time With Efficient Linear PA's"; IEEE, Feb. 10, 2000; 22 pages.

(Continued)

*Primary Examiner* — Simon Nguyen
(74) *Attorney, Agent, or Firm* — Leydig, Voit & Mayer, Ltd.

(57) ABSTRACT

A wireless communication system (400) for power amplification of an input signal includes a power amplifier (404) operable to amplify a data signal (405). An envelope generator 408 or detector is operable to determine an envelope signal (410) from the data signal. A tracking power supply or other power supply control circuit (409) is operable to control a supply voltage of the power amplifier with the envelope signal. An allocation manager (441) is operable to determine a resource block allocation within a channel for the data signal. A delay circuit (443) is operable to insert a delay (550) between the envelope signal and the data signal as a function of the resource block allocation within the channel, thereby intentionally causing unbalanced leakage about the resource block allocation. Increased leakage on one side of the allocation results in improved leakage on the other side.

19 Claims, 4 Drawing Sheets

(56) References Cited

U.S. PATENT DOCUMENTS

| | | |
|---|---|---|
| 2002/0094795 A1 | 7/2002 | Mitzlaff |
| 2003/0114127 A1* | 6/2003 | Baldwin .................. 455/245.1 |
| 2004/0127173 A1 | 7/2004 | Leizerovich |
| 2004/0147276 A1 | 7/2004 | Gholmieh et al. |
| 2005/0078743 A1 | 4/2005 | Shohara |
| 2006/0068830 A1 | 3/2006 | Klomsdorf et al. |
| 2006/0128324 A1 | 6/2006 | Tan et al. |
| 2008/0025254 A1 | 1/2008 | Love et al. |
| 2009/0088093 A1* | 4/2009 | Nentwig .................. 455/114.3 |
| 2009/0091384 A1* | 4/2009 | Sorrells et al. ........... 330/207 R |
| 2010/0194474 A1* | 8/2010 | Ishikawa et al. ............. 330/149 |
| 2011/0050339 A1* | 3/2011 | Ohkawara et al. ........... 330/149 |
| 2011/0260792 A1* | 10/2011 | Ishikawa et al. ............. 330/149 |
| 2012/0021695 A1 | 1/2012 | Murji |
| 2012/0263256 A1* | 10/2012 | Waheed et al. ............... 375/296 |
| 2013/0182663 A1* | 7/2013 | Ji et al. ........................ 370/329 |

OTHER PUBLICATIONS

Patrick Hosein, Tao Wu; "Dynamic Power Headroom Threshold for Mobile Rate Determination in a CDMA Network"; IEEE, May 2004; 5 pages.

XP-002355569; "Comparison of PAR and Cubic Metric for Power De-Rating";TSG RAN WG4 #31; Tdoc#R4-040367, Tdoc,#R1-04522, May 10, 2004; 6 pages.

Motorola; "Comparison of PAR and Cubic Metric for Power De-rating", TSG RAN WG1 #37, Tdoc# R1-040642, Montreal, Canada, May 10-14, 2004, all pages.

Anritsu, Testing the Future, LTE Resource Guide, www.us.anritsu.com, Anritsu Company 2009, all pages.

\* cited by examiner

METHOD AND APPARATUS FOR IMPROVING EFFICIENCY AND DISTORTION LEAKAGE IN A WIRELESS POWER AMPLIFIER

BACKGROUND

1. Technical Field

This invention relates generally to wireless communication, and more particularly to methods and apparatuses for operating a power amplifier in a wireless communication system.

2. Background Art

Wireless communications devices employ circuits having power amplifiers. Power amplifiers are used to amplify, for example, transmission data signals for transmission through an antenna circuit. An ideal amplifier for wireless communications is linear and power efficient. Said differently, the input-output transfer function of a wireless communication power amplifier should be linear, with a perfect replica of the input signal, increased in amplitude, appearing at the output of the power amplifier. This output signal is then delivered to an antenna system for wireless transmission to other devices.

It is understood that efficiency of wireless communication systems can be enhanced when power amplifiers are run at—or near—their saturation levels. This means that the actual power output by the power amplifier is just below the maximum rated output power level. Output power is tied to the supply voltage of the power amplifier. Accordingly, a greater supply voltage will produce a correspondingly greater output power. For larger input signals, higher output power is required to run the power amplifier in saturation. Most prior art power amplifiers, however, used fixed power supplies. Since input signals can vary by orders of magnitude, fixed supply voltages are terribly inefficient and result in large current drain since the power amplifier is frequently not operating in saturation.

There has been some effort expended in constructing power supplies that vary the supply voltage that is applied to the power amplifier. Examples include power supply modulation, which varies the supply voltage by using a signal detector and a tracking power supply. However, prior art power supply modulation techniques suffer from problems. Illustrating by example, they tend to have poorer efficiency characteristics than fixed power supplies and sometimes can only be used in narrowband applications.

In contemporary broadband wireless communication applications, such as the 3GPP Long Term Evolution (LTE) project, practical considerations such as extending battery life set performance requirements on the operation of the power amplifier. The goal of these design considerations is to minimize power amplifier power consumption, cost, and complexity. Generally, required conducted power levels must be achieved within a specified lower bound on in-band signal quality, or error vector magnitude of the desired waveform, while staying below an upper bound of signal power leakage out of the desired signal channel or resource block allocation.

While the issues above represent traditional power amplifier challenges, they do not provide solutions. Further, to be commercially viable, it is advantageous for solutions capable of meeting the specification to be low cost and robust. Additionally, solutions must be capable of addressing issues not set forth in specifications, including being able to optimize when transmitting new waveforms, when transmitting packet based data in accordance with schedules dictated by new networks, and when transmitting across different frequency or spatial wireless communication technologies. This optimization should occur while maintaining adherence to the requirement standards as well. It would thus be advantageous to have an improved power amplifier circuit.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with embodiments of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF EMBODIMENTS OF THE INVENTION

Before describing in detail embodiments that are in accordance with the present invention, it should be observed that the embodiments reside primarily in combinations of method steps and apparatus components related to operating a power amplifier in a power amplifier module of a wireless communication circuit to improve selected leakage and current drain. Any process descriptions or blocks in flow charts should be understood as representing modules, segments, or portions of code that include one or more executable instructions for implementing specific logical functions and methods or steps in the process. Alternate implementations are included, and it will be clear that functions may be executed out of order from that shown or discussed, including substantially concurrently or in reverse order, depending on the functionality involved. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

It will be appreciated that embodiments of the invention described herein may be comprised of one or more conventional processors and unique stored program instructions that control the one or more processors to implement, in conjunction with certain non-processor circuits, some, most, or all of the functions of improving current drain in a power amplifier and/or selectively manipulating leakage based upon application or carrier signal characteristics as described herein. The non-processor circuits may include, but are not limited to, a radio receiver, a radio transmitter, signal drivers, clock circuits, power source circuits, and user input devices. As such, these functions may be interpreted as steps of a method to perform manipulation of leakage or reduction of current drain. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Embodiments of the invention are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. Also, reference designators shown herein in parenthesis indicate components shown in a figure other than the one in discussion. For example, talking about a device (10) while discussing figure A would refer to an element, 10, shown in figure other than figure A.

Figure 1:
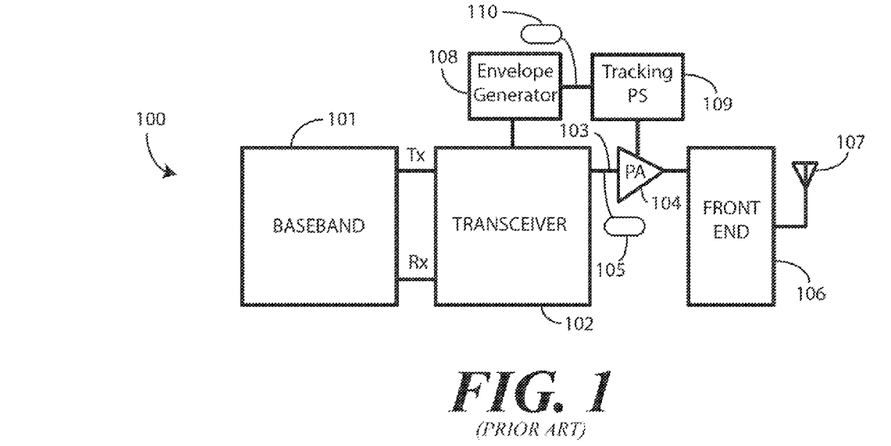
FIG. 1 illustrates a prior art wireless communication circuit.

Turning now to FIG. 1, illustrated therein is a prior art wireless communication system 100. A baseband processor 101 communicates with a transmitter 102 via transmit (Tx) and receive (Rx) lines to transmit wireless data signals. During transmission, the transmitter 102 has an output 103 that is coupled to a power amplifier 104. The power amplifier 104 amplifies data signals 105 for delivery to a frontend network 106 that is operable with an antenna 107. The amplified signals of the power amplifier 104 are transmitted as wireless signals from the antenna 107.

The system 100 also includes an envelope generator 108 and a tracking power supply 109. The envelope generator 108 is used to generate a voltage that is an "envelope" of the data signal 105. This voltage is referred to as an "envelope signal" 110. The tracking power supply 109 is used to provide the power amplifier 104 with a supply voltage based upon the envelope signal 110 from the envelope generator 108. The tracking power supply 109 is, in effect, trying to provide the power amplifier 104 with a supply voltage that is substantially a quantized version of the envelope signal 110.

The combinations of envelope generator 108 and tracking power supply 109 of prior art systems have been configured in a few different ways. For example, one prior art solution, known as envelope elimination restoration, utilizes a limiter to provide an essentially constant drive level to the power amplifier to maintain the amplifier in a hard saturation state and increase efficiency. Use of the limiter, however, greatly expands the bandwidth of the RF signal input to the amplifier, and requires very accurate tracking of the envelope signal 110, with a power supply switching frequency approximately ten times greater than the bandwidth of the data signal 105. As these switching frequencies increase, the transistors within the tracking power supply 109 become less efficient, resulting in excessive power losses. The resulting bandwidth expansion of the limiter also requires the bandwidth capability of the power amplifier 104 to be significantly greater than the input signal bandwidth, limiting the envelope elimination restoration configuration to narrow bandwidth applications, such as amplitude modulation broadcasts.

A second configuration, commonly known as basic envelope tracking, does not use a limiter. However, it can introduce significant non-linearities in the output signal of the power amplifier 104, such as gain distortions, phase distortions, and other voltage parasitics. For example, some prior art power amplifiers include laterally diffused metal oxide semiconductor field effect transistors. While these transistors have good linearity with respect to input power, they have large variations in gain and phase as a function of supply voltage. When basic envelope tracking is used to increase efficiency, these variations result in intermodulation distortion, spectral growth, and leakage.

Figure 2:
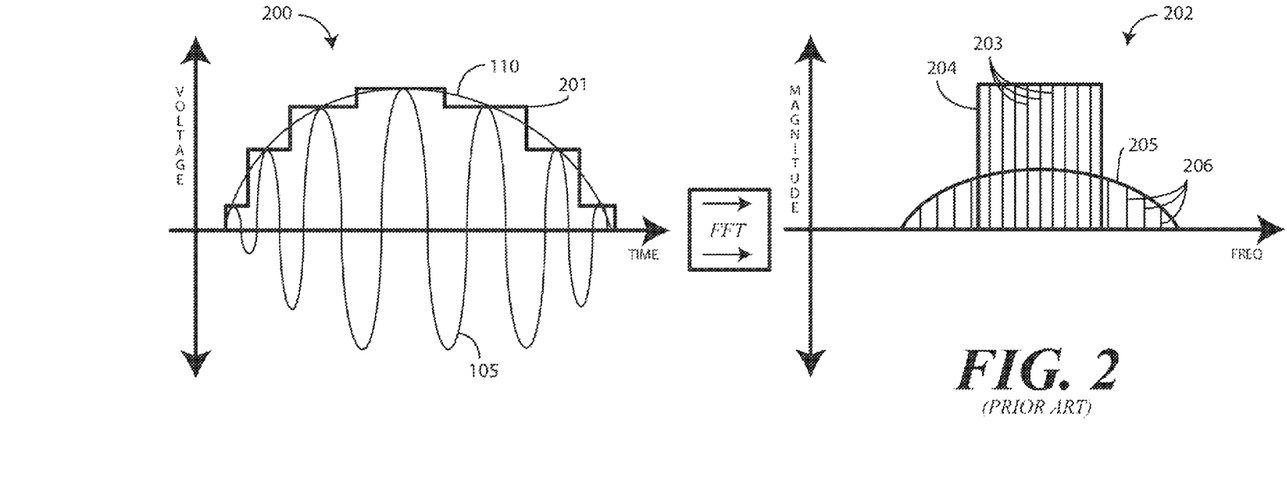
FIG. 2 illustrates prior art wireless communication circuit signals.

Regardless of the system used, the goal of all prior art systems is to "sync" the envelope signal 110 with the data signal 105 so the supply voltage of the power amplifier 104 tracks its input when amplifying the data signal. This is done with the goal of improving efficiency by maintaining the power amplifier 104 at or near saturation. Moreover, all prior art systems operate to tightly align the envelope signal 110 with the data signal to prevent distortion on the output of the power amplifier 104. Turning now to FIG. 2, illustrated therein are time-varying waveforms 200 that illustrate this concept.

As shown in FIG. 2, the data signal 105 is a time-varying signal used to transmit data on subcarriers within a channel allocated to the wireless communication system (100). The envelope generator (108) then functions to create the envelope signal 110, which is a voltage derived from the data signal 105. In FIG. 2 the envelope signal 110 is almost perfectly synchronized with the data signal 105. This envelope signal 110 is then delivered to the tracking power supply (109), which generates a corresponding tracking supply voltage 201. As with the envelope signal 110, the tracking supply voltage 201 is synchronized with the data signal 105, as this is the goal of the wireless communication system (100).

There is a problem associated with the system (100), however, which can be seen in the Fourier transform 202 of the time-varying data signal 105. As noted above, the data signal 105 is a time-varying signal used to transmit data on subcarriers within a channel allocated to the wireless communication system (100). The subcarriers 203 and channel 204 are shown in the Fourier transform 202 of the data signal 105. In effect, the channel 204 is defined by the collection of subcarriers 203 that are allocated to that channel 204. The RF carrier used in modulating the data signal 105 is shown illustratively here as nine subcarriers 203. The subcarriers 203 are spaced in equal intervals across the channel 204.

The problem with the wireless communication system (100) is the $3^{rd}$ order intermodulation distortion 205 referenced above. This distortion manifests itself as low-level subcarriers 206 disposed outside the channel 204. This phenomenon is known as "channel leakage" due to the fact that the spectrum in this embodiment is divided into channels. "Adjacent channel leakage" as used herein will refer to distortion, spectral noise, or spectral regrowth occurring on channels other than those allocated for communication. However, general "leakage" may be used to describe distortion occurring on portions of the spectrum other than those allocated to a particular system for communication. Thus, "leakage" in a general sense can refer to any of poor adjacent channel leakage, poor adjacent resource block leakage, spectrum emissions mask, and/or reduced receiver sensitivity or performance. "Adjacent resource block leakage," for example, can refer to distortion causing leakage into resource blocks other than those allocated to a particular system for communication.

The general measurement for adjacent channel leakage is referred to as the adjacent channel leakage ratio (ACLR). ACLR considers the amount of distortion occurring in channels other than those allocated to the system (100). In this prior art embodiment, the ACLR is substantially symmetrical about the subcarriers 203. Note that while there can be some residual imbalance of ACLR in practice, prior art designs attempt to minimize this to achieve the substantially symmetrical subcarrier balance. Consequently, energy leaks into channels both lower in frequency and higher in frequency than the allocated channel 204. The resulting distortion is symmetrical because it results from distortion products of the various subcarriers 203 in the channel 204 due to the operation of the prior art wireless communication system (100). This is due in part to the fact that the prior art wireless communication system (100) transmits data on all the subcarriers 203 within the channel 204.

Excessive channel leakage is extremely problematic. Not only does it risk the wireless communication system (100) not being able to comply with the standards for transmission, but it degrades the performance of the adjacent channels, resulting in reduced communication quality among groups of devices operating in the field. Embodiments of the present invention provide novel and innovative solutions to reducing ACLR while also improving the efficiency of power amplifier operation by reducing current drain, as will be shown and described below.

Figure 3:
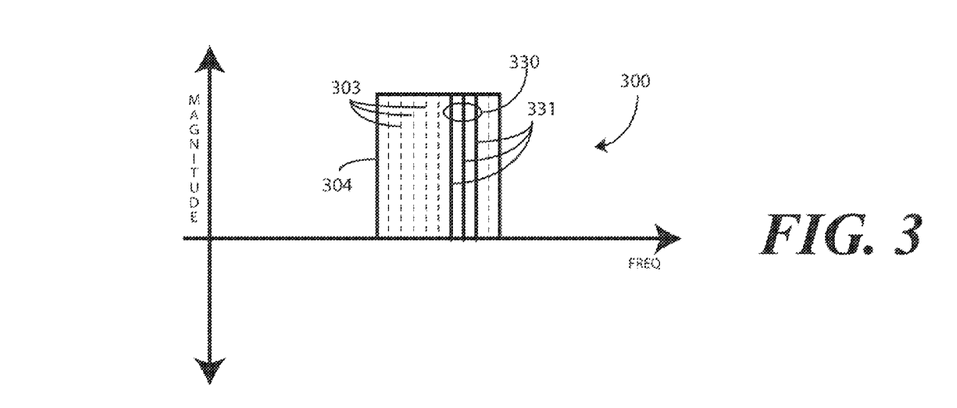
FIG. 3 illustrates a transmission frequency suitable for usage with one or more embodiments of the invention.

Turning now to FIG. 3, illustrated therein is an exemplary transmission waveform 300 with which embodiments of the present invention advantageously function. As with the Fourier transform (202) of FIG. 2, the exemplary transmission waveform 300 is shown as a frequency plot with a channel 304 defined by a plurality of resource blocks 303. However, rather than transmitting on all resource blocks of the channel 304, embodiments of the present invention contemplate transmitting data only on a portion 330 of the resource blocks 303. In this illustrative embodiment, three resource blocks 331 are allocated for data transmission within the channel 304. The remaining resource blocks 303 can then be shared with other users.

Embodiments of the present invention provide for advantageous manipulation of power amplifier operation for situations in which only a portion 330 of the resource blocks 303 is used. Illustrating by example, by introducing delays between envelope signals and data signals, embodiments of the invention contemplate that any corresponding leakage due to distortion can be manipulated to actually degrade—or get worse—on one side of the transmission spectrum. While poorer leakage performance may seem to those or ordinary skill in the art not having the benefit of this disclosure to be deleterious, embodiments of the invention actually cause this intentionally to take advantage of improvements on the opposite side of the spectrum. Illustrating by example, if the portion 330 of resource blocks 303 is disposed on the right side of the channel 304, as shown in FIG. 3, embodiments of the invention contemplate that delays between an envelope signal and corresponding data signal can be introduced to cause distortion signals to degrade on the left side of the portion 330 of resource blocks 303. However, this causes distortion signals to significantly improve on the right side of the portion 330 of resource blocks 303, thereby reducing leakage and accordingly improving the ACLR.

Figure 4:
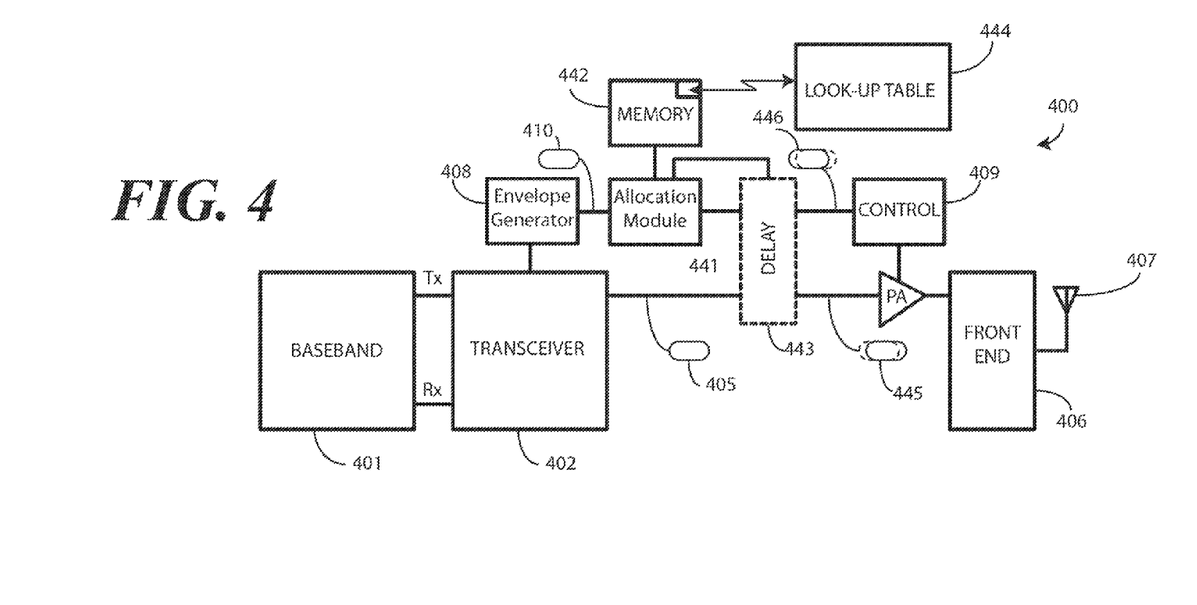
FIG. 4 illustrates a schematic block diagram of one explanatory system configured in accordance with one or more embodiments of the invention.

Turning now to FIG. 4, illustrated therein is one explanatory wireless communication system 400 configured in accordance with one or more embodiments of the invention. The wireless communication system 400 is configured to provide for high efficiency, wideband linear power amplification in wireless applications, while strategically mitigating ALCR. The wireless communication system 400 is well suited to work in a variety of wireless communication network architectures, including 3GPP LTE networks. For example, while a LTE application is an illustrative embodiment, the components of the wireless communication system 400 can be used in other networks as well, including LTE, WCDMA, and CDMA. As will be described below, the wireless communication system 400 can be used to reduce leakage, such as resource block leakage or spectral regrowth onto resource blocks other than those allocated to the wireless communication system 400 for communication, as well as for the improvement of ACLR, spectrum emissions mask, and/or receive band sensitivity.

The wireless communication system 400 includes a baseband processor 401 communicates with a transceiver 402 via transmit (Tx) and receive (Rx) lines to transmit and receive wireless data signals. During transmission, the transceiver 402 has an output 403 that is coupled to a power amplifier 404. The power amplifier 404 is operable to amplify data signals 405 for delivery to a frontend network 406 that is operable with an antenna 407. The amplified signals of the power amplifier 404 are transmitted as wireless signals from the antenna 407. The antenna 407 can optionally be configured to receive wireless signals as well.

The envelope generator 408 and power supply control circuit 409 work in tandem to track the data signal 405 and provide a variable supply voltage (on line 450) to the power amplifier 404 to maintain the power amplifier 404 at or near saturation and increase the efficiency of the power amplifier over a wide range of variation of the data signal 405. The envelope generator can include an envelope detector operable to determine an envelope signal 410 from the data signals 405. The power supply control circuit 409, which in one embodiment is a tracking power supply, is operable to control a supply voltage of the power amplifier 404 with the envelope signal 410. In one embodiment, the envelope generator 408 can control the power supply control circuit 409 by applying the envelope signal 410 to a tracking power supply coupled to the power amplifier 404 in one embodiment. In other embodiments, the variable supply voltage can be applied in other ways. For instance, the power supply control circuit 409 can control one of a load, bias, or supply voltage of the power amplifier 404 with the envelope signal 410. Such techniques are described in commonly assigned US Published Patent Application No. 2006/0068830, entitled "Signal Configuration Based Transmitter Adjustment in Wireless Communication Devices," which is incorporated herein by reference for all purposes.

The transceiver 402 can include input signal conditioners, such as nonlinear phase mappers, phase adjusters, nonlinear gain mappers, and gain adjusters, which can function to essentially pre-distort or otherwise condition an input signal to provide a conditioned data signal to the power amplifier 404. Such signal conditioners can be included to counteract any phase and gain distortions introduced within the power amplifier 404 from variations in the supply voltage coming from the power supply control circuit 409. The inclusion of input signal conditioners, working in tandem with the envelope generator 408 and the power supply control circuit 409, work to minimizes phase and gain distortions in the amplified output signal. Moreover, it can provide for effectively linear, high efficiency power amplification in broadband applications. Such input signal conditioners are described in commonly assigned US Published Patent Application No. 2002/0094795, entitled "High Efficiency Wideband Linear Wireless Power Amplifier," which is incorporated herein by reference for all purposes.

An allocation manager 441 is operable to determine a resource block allocation within a channel for the data signal 405. Recall from FIG. 3 that in one or more embodiments, the data signal 405 is transmitted only on a portion (330) of the resource blocks (303) in a channel 304. THE allocation manager 441 is responsible for determining which resource blocks (331) are in the portion (330). The allocation manager 441 can also be configured to determine where within the channel (304) the resource blocks (331) or portion (330) is located. The allocation manager 441 can also be configured to measure of a closeness of the resource block allocation, i.e., the portion (330) to an edge of the channel (304).

The allocation manager 441 can perform this function in a variety of ways. Illustrating by example, a base station of a wireless communication system may make scheduling systems regarding which resource blocks (331) within a channel (304) a particular device should use, while sharing the unused resource blocks (303) with other devices. The base station can then communicate instructions to the device that indicates these resource block (331). The allocation manager 441 can receive these instructions to determine inter alia the portion (330) and/or where the portion (330) is within the channel (304).

In one or more embodiments, once the allocation manager 441 has determined one or more resource blocks (331) within a channel (304) on which the data signal 405 will be transmitted, the allocation manager 441 is configured to delay one of the envelope signal 410 or the data signal 405 as a function of resource block allocation within the channel (304) with a delay circuit 443. The delay can be based upon resource block allocation, upon number of resource blocks used, or other factors. This will, in turn, cause asymmetrical leakage about the allocated resource block(s) (331). The delay introduced moves the power supply signal delivered to the power amplifier 404 "off," or out of synchronization, from optimum alignment with the data signal 405 by a predetermined amount. This, in turn, causes increased spectral distortion regrowth on one side of the transmission spectrum and reduced distortion on the other side.

Which side experiences worsened spectral regrowth can be controlled by controlling the amount of delay introduced by the delay circuit 443. If the delay introduced on the envelope path is less than nominal, the increased spectral growth will appear on the lower frequency side of the transmission spectrum. If the delay introduced is higher than nominal, the spectral growth will appear on the upper frequency side of the spectrum. Since embodiments of the invention contemplate transmission on less than a fully allocated channel as described above with reference to FIG. 3, embodiments can shift some of the spectral regrowth energy out of an adjacent channel and into the channel in which the wireless communication system 400 is transmitting. While this spectral regrowth energy is within an allocated channel, it is not on the allocated resource blocks being used by the power amplifier 404. Accordingly, the allocation manager 441 can use the delay circuit 443 to perform delay shifts between the envelope signal 410 and the data signal 405 that cause out of channel spectrum to decrease, which improves ALCR, adjacent resource block leakage, spectrum emissions mask, receiver sensitivity, or combinations thereof, and helps the wireless communication system 400 to comply with corresponding system specifications. At the same time, the power amplifier 404 can be driven further into compression to reduce current drain and improve its overall efficiency. Introductions of distortion into an allocated channel and out of an adjacent channel are advantageous because the ACLR specifications for a channel in use are generally more relaxed than for those in adjacent channels.

In one embodiment, a memory 442 is operable with the allocation manager 441. Once the envelope generator 408 determines an envelope signal 410 based upon the data signal 405, and the allocation manager 441 determines one or more resource blocks within a channel on which the data signal will be transmitted, the allocation manager 441 can access a look-up table 444 stored within the memory 442 to determine what delay to introduce between the envelope signal 410 and the data signal 405. In other embodiments, the delay can be controlled by the baseband processor 401 in response to the allocation manager 441.

In one embodiment, the look-up table 444 comprises a plurality of delay values, with each delay value corresponding to an allocation of the resource block within the channel. These delay values can be optimized in a lab based upon the architecture and performance of the wireless communication system 400 and the various allocations of resource blocks within a channel that may be encountered. For instance, delay values or functions can be characterized and stored in the look-up table 444 based upon the resource blocks allocated to take maximum benefit of the delay effect. Spectral growth under a given set of operating conditions is possible because the power radiated into an adjacent frequency band, and the distortion offered therefrom within the set of time-frequency resources allocated by a base station, is governed by several practical design criteria related to the implementation of mobile terminal transmitters, including oscillator phase noise, digital-analog converter noise, power amplifier (PA) linearity (in turn controlled by power amplifier mode, cost, power consumption etc.), among others.

Based upon the determined allocation, the allocation manager 441 can retrieve the proper delay amount to optimize spectral regrowth for minimal ACLR, spectral emissions mask, and/or receiver sensitivity. The delay circuit 443 is then operable to insert a delay between the envelope signal 410 and the data signal 405 as a function of the resource block allocation within the channel, thereby causing unbalanced leakage about the resource block allocation. In one or more embodiments, the unbalanced leakage comprises increased leakage within the channel and reduced leakage outside the channel. This process can be repeated in real time, thereby providing for the adjustment of the delaying process as a function of changes to the resource block allocation within the channel.

Using a simple example for illustration, testing has shown that ACLR, spectral emissions mask, and/or receiver sensitivity can be improved by 6.3 dB by introducing a +14 nanosecond delay to the envelope signal 410 when the allocated resource blocks are on the lower frequency side of the channel. Where the allocated resource blocks are on the higher frequency side of the channel, a +14 nanosecond delay to the data signal 405 could be used for similar ACLR, spectral emissions mask, and/or receiver sensitivity improvement. The amount of envelope delay can be adjusted "on the fly" for dynamic efficiency and ACLR, spectral emissions mask, and/or receiver sensitivity improvement.

In other embodiments, the allocation manager 441 can retrieve and/or functions based upon resource block allocation from the look-up table 444 stored in the memory 442. For example, in one embodiment the requisite delay may be a function of the resource block allocation determined by the allocation manager 441. Accordingly, the allocation manager may determine the function of resource block allocation within the channel by accessing a look-up table 444.

As an alternative to employing a look-up table 444, the allocation manager 441 can use functions to determine the delay. Illustrating by example, the following equation can be used to determine delay:

$$\text{Delay} = A^*(Fc-Frb) + B^*(Fc-Frb)^3 * C/(\text{resource block number}) \quad (\text{EQ. 1})$$

where
Fc=center frequency of allocated channel;
Frb=center frequency of the resource block allocation;
A and B are coefficients of characterized polynomial curve fit; and
C=the scaling factor for the number of resource blocks.

The values of A, B, and C can be optimized and a per CHBW basis.

To demonstrate that the delay could be applied to either the data signal 405 or the envelope signal 410, for illustration purposes both a delayed data signal 445 and delayed envelope signal 446 are shown in FIG. 4. However, it will be understood by those of ordinary skill in the art having the benefit of this disclosure that embodiments of the invention do not require the delay circuit 443 to be operable on both the data signal 405 and the envelope signal 410. The delay circuit 443 may only apply a single delay to the envelope signal 410, or alternatively to the data signal 405, to cause the mismatch in time with respect to when those signals are applied to the power amplifier 404.

Embodiments of the invention allow manipulation of either the envelope supply path or the data input path, which in prior art systems track each other to improve efficiency as well. This allows the power supply control circuit 409 to be more aggressive in driving the power supply voltage corresponding to the envelope signal 410 more closely to make the power amplifier 404 more efficient. In prior art systems designers must introduce headroom between the voltage applied to the power amplifier 404 and the data signal to avoid degradation. However, by introducing the delay, the power amplifier 404 can be driven "harder into compression" to get better current drain improvement.

Figure 5:
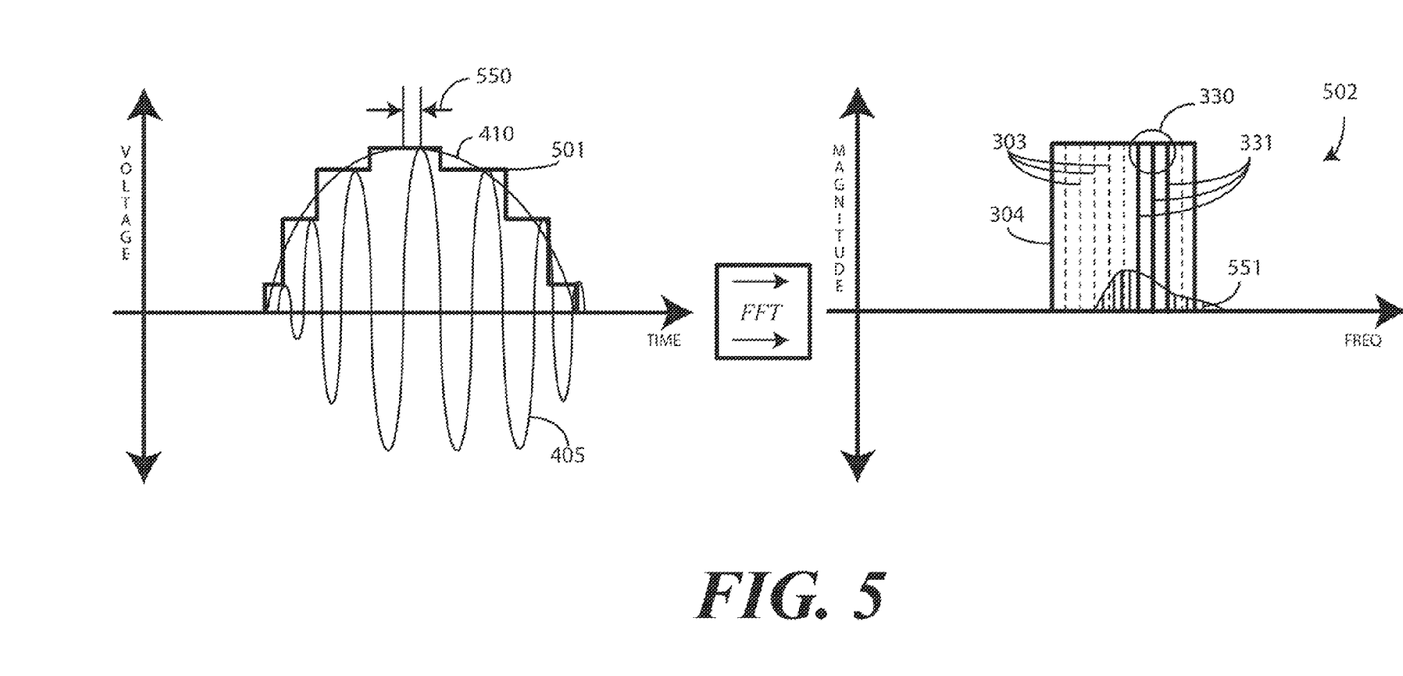
FIG. 5 illustrates explanatory wireless communication signals in accordance with one or more embodiments of the invention where power amplifier operation has been modified to cause leakage to be asymmetric.

Turning now to FIG. 5, illustrated therein is one explanatory output of the wireless communication system (400) of FIG. 4. As shown in FIG. 5, the data signal 405 is a time-varying signal used to transmit data on only a portion 330 of resource blocks 331 within a channel 304 allocated to the wireless communication system (400). The envelope generator (408) functions to create the envelope signal 410, which is a voltage derived from the data signal 405. The power supply control circuit (409) is then used to further track (or quantize) the envelope signal 410 and to provide a higher or greater level of supply voltage and current to the power amplifier (404). For example, in one embodiment, for faster operation and for greater bandwidth capability (e.g., to 10 MHz or more), power supply control circuit 409 has an output that is stepped or switched, providing a quantized power supply voltage 510 to the power amplifier (404).

In contrast to the signals shown in FIG. 2 above, the envelope signal 410 and resulting power supply voltage 510 are not synchronized with the data signal 405. To the contrary, the delay circuit (443) has introduced a delay 550 between the envelope signal 410 and the data signal 405. The delay 550 causes the corresponding tracking supply voltage 501 to reach the power amplifier (404) out of synchronization with the data signal 405.

The result of this is shown in the Fourier transform 502 of the data signal 405. Leakage has increased on resources of the channel 304 other than those being used by the power amplifier (404). This is due to the fact that the insertion of the delay 550 between the supply voltage, which is time varying, and the corresponding data signal 405 has causes asymmetrical leakage about the used resource blocks 331. This results in increased leakage within the channel 304 and reduced leakage outside the channel 304. In this illustrative embodiment, increased leakage occurs in lower frequency resource blocks, while reduced leakage occurs in higher frequency resource blocks. "Out of channel" leakage 551 is thereby reduced. Of course, if the portion 330 of resource blocks 303 were in the lower frequency portion of the channel 304, the opposite may be true. The inserted delay may function to increase leakage in higher frequency resource blocks and reduce leakage in lower frequency resource blocks.

Causing increased leakage within the channel 304 to reduce out of leakage 551 is but one reason for employing embodiments of the invention. There are numerous others. Illustrating by example, it is not desirable to deliver substantial spectral regrowth energy into a public safety band. Accordingly, in one or more embodiments, the function of the resource block allocation determined by the allocation manager (441) comprises a measure of a used closeness of the resource block allocation to a public safety band. In such embodiments, the resulting unbalanced leakage comprises reduced leakage in the public safety band and increased leakage in resource blocks of the channel other than the public safety band.

In other embodiments, there may be very narrow band duplex gaps between receive band resource blocks(s) and transmit band resource block(s). Accordingly, in such embodiments the delaying reduces leakage in the corresponding receive resource block and increases leakage on resource blocks other than the corresponding receive resource block. Where the allocated resource blocks comprise a transmit resource blocks a corresponding receive resource block, the delay can avoid spilling noise into the receive band that a particular device is using.

Regardless of what frequency one is adding spectral regrowth energy to in order to reduce energy delivered to another frequency, embodiments of the invention can be used to achieve three distinct benefits. A first benefit is a reduction of ACLR as previously described. A second benefit is emission improvement into other coexisting bands having more strict standards. A third benefit is improvement in a receive band by reducing spectral regrowth energy in that receive band and delivering it to an opposite side of the resource block group in use.

Figure 6:
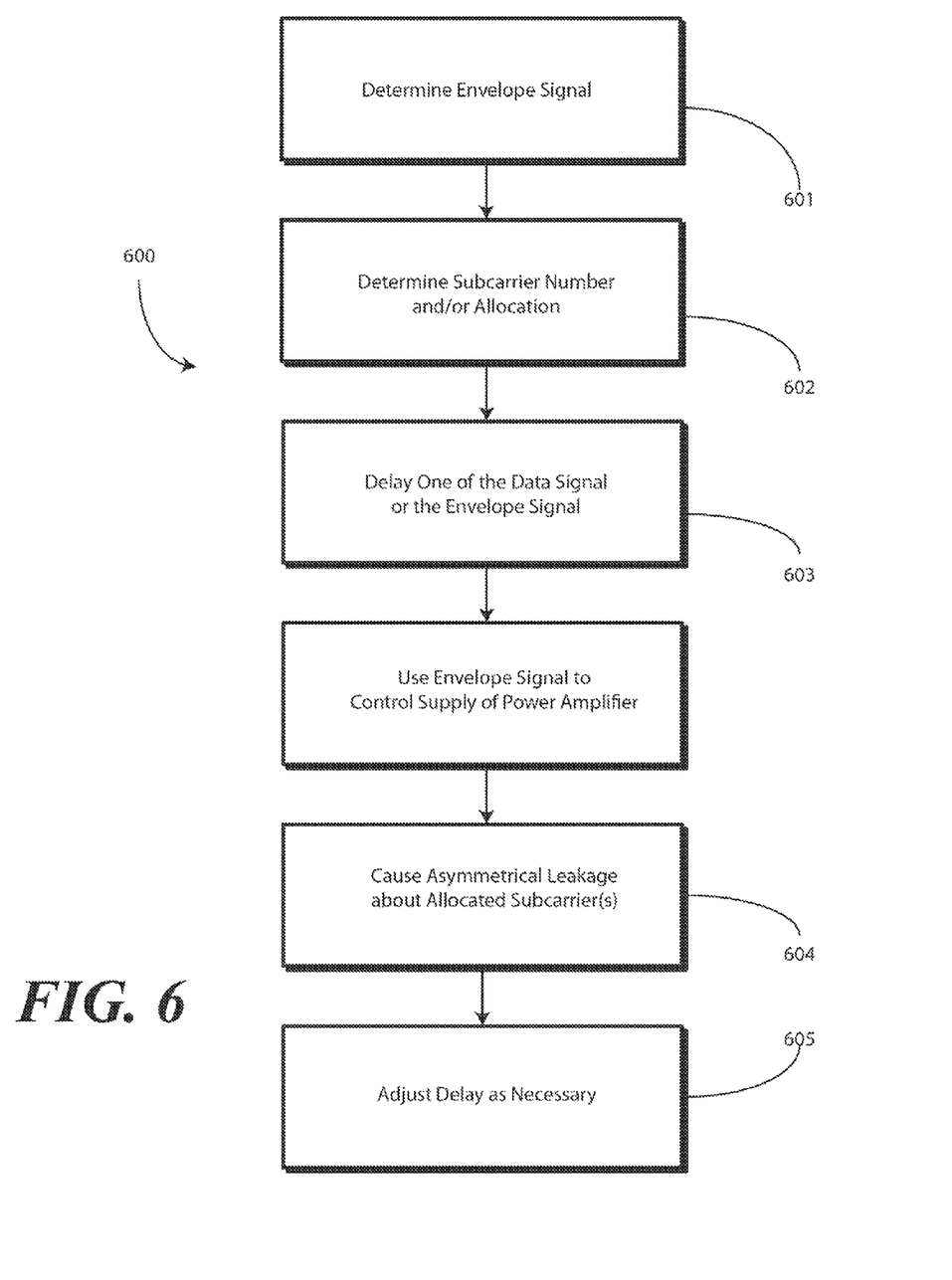
FIG. 6 illustrates an explanatory method of controlling a power supply voltage of a power amplifier in a power amplifier module in accordance with one or more embodiments of the invention.

Turning now to FIG. 6, illustrated therein is one exemplary method 600 of controlling spectral regrowth about a resource allocation within a wireless transmission channel in accordance with one or more embodiments of the invention. The method 600 includes inserting a delay between a time varying supply voltage applied to a power amplifier (as a function of a data signal) and the data signal to increase leakage within the channel and reduce leakage outside the channel. In one or more embodiments, the delay is a function of the resource allocation within the wireless transmission channel. The result can be an increase of leakage on resources of the wireless transmission channel other than those being used by the power amplifier. In one or more embodiments, the delay can be determined by selecting a delay value from a plurality of delay values, where each delay value corresponds to a predefined allocation of the resource block within the wireless transmission channel.

At step 601, the method determines an envelope signal based upon a data signal. This envelope signal can be used with a tracking power supply to adjust the supply voltage applied to a power amplifier to increase efficiency by reducing headroom during amplification of the data signal.

At step 602, the method determines a resource block within a channel on which the data signal will be transmitted. Once this is determined, a delay that corresponds to the resource block allocation or a function of resource block allocation suitable for use in determining a delay can be determined as well. In one or more embodiments, this is performed by accessing a look-up table. The look-up table may have stored therein a plurality of delay values or a plurality of functions, with each delay value or function corresponding to an allocation of the resource block within the channel, a hardware configuration of the power amplifier and corresponding circuit elements, or combinations thereof.

When the delay is known, at step 603 the method includes delaying one of the envelope signal or the data signal to be amplified as a function of the resource block allocation. At step 604, in response to the delay inserted at step 603, the method includes controlling the power amplifier to cause asymmetrical leakage about the allocated resource block. This step 604 can also include controlling one of a load, bias, or supply voltage of the power amplifier with the envelope signal to improve efficiency by saturating the power amplifier to "open up" more margin to the applicable spectral specification. At step 605, the delay can be adjusted to make the method 600 dynamic in responding to, for example, changes to the resource block allocation within the allocated channel.

In one embodiment, the delaying step 603 increases leakage within the channel and reduces leakage outside the channel. In another embodiment, the delaying step 603 increases leakage in higher frequency resource blocks and reduces leakage in lower frequency resource blocks. In another embodiment, the delaying step 603 increases leakage in lower frequency resource blocks and reduces leakage in higher frequency resource blocks. Where an allocated resource block portion comprises a transmit resource block and has associated therewith a corresponding receive resource block, the delaying step 603 reduces leakage in the corresponding receive resource block and increases leakage on resource blocks other than the corresponding receive resource block.

In the foregoing specification, specific embodiments of the present invention have been described. However, one of ordinary skill in the art appreciates that various modifications and changes can be made without departing from the scope of the present invention as set forth in the claims below. Thus, while preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

What is claimed is:

1. A method for controlling a power supply voltage of a power amplifier in a power amplifier module, comprising:
   determining an envelope signal based upon a data signal;
   determining a resource block within a channel on which the data signal will be transmitted;
   delaying one of the envelope signal or the data signal as a function of a resource block allocation within the channel; and
   after the delaying, controlling a power supply of the power amplifier with the envelope signal and applying the data signal to the power amplifier to cause asymmetrical leakage about the resource block.

2. The method of claim 1, further comprising adjusting the delaying as a function of changes to the resource block allocation within the channel.

3. The method of claim 1, wherein the controlling further comprises controlling one of a load, bias, or supply voltage of the power amplifier with the envelope signal to improve efficiency of the power amplifier.

4. The method of claim 1, wherein the controlling comprises applying the envelope signal to a tracking power supply of the power amplifier.

5. The method of claim 1, further comprising determining the function of resource block allocation within the channel by accessing a look-up table.

6. The method of claim 5, wherein the look-up table comprises a plurality of delay values, each delay value corresponding to an allocation of the resource block within the channel.

7. The method of claim 1, wherein the delaying increases leakage within the channel and reduces leakage outside the channel.

8. The method of claim 1, wherein the delaying increases leakage in higher frequency resource blocks and reduces leakage in lower frequency resource blocks.

9. The method of claim 1, wherein the delaying increases leakage in lower frequency resource blocks and reduces leakage in higher frequency resource blocks.

10. The method of claim 1, wherein the resource block comprises a transmit resource block and has associated therewith a corresponding receive resource block, wherein the delaying reduces leakage in the corresponding receive resource block and increases leakage on resource blocks other than the corresponding receive resource block.

11. A system for power amplification of an input signal, comprising:
    a power amplifier operable to amplify a data signal;
    an envelope detector operable to determine an envelope signal from the data signal;
    a tracking power supply operable to control a supply voltage of the power amplifier with the envelope signal;
    an allocation manager operable to determine a resource block allocation within a channel for the data signal; and
    a delay circuit operable to insert a delay between the envelope signal and the data signal as a function of the resource block allocation within the channel, thereby causing unbalanced leakage about the resource block allocation.

12. The system of claim 11, wherein the function of the resource block allocation within the channel comprises a measure of a closeness of the resource block allocation to an edge of the channel.

13. The system of claim 12, wherein the unbalanced leakage comprises increased leakage within the channel and reduced leakage outside the channel.

14. The system of claim 11, wherein the function of the resource block allocation comprises a measure of a closeness of the resource block allocation to a public safety band.

15. The system of claim 14, wherein the unbalanced leakage comprises reduced leakage in the public safety band and increased leakage in resource blocks of the channel other than the public safety band.

16. The system of claim 11, further comprising a memory, operable with the allocation manager, wherein the memory stores a look-up table comprising a plurality of delay values, each delay value corresponding to an allocation of one or more resource blocks within the channel.

17. A method of controlling spectral regrowth about a resource allocation within a wireless transmission channel, comprising inserting a delay between a time varying supply voltage applied to a power amplifier as a first function of a data signal to increase leakage within the wireless transmission channel and reduce leakage outside the wireless transmission channel, wherein the delay is a second function of the resource allocation within the wireless transmission channel.

18. The method of claim 17, further comprising increasing leakage on resources of the wireless transmission channel other than those being used by the power amplifier.

19. The method of claim 17, further comprising determining the delay by selecting a delay value from a plurality of delay values, where each delay value corresponds to a predefined allocation of the one or more resource blocks within the wireless transmission channel.

* * * * *